US006335062B1

(12) United States Patent
Sartwell et al.

(10) Patent No.: US 6,335,062 B1
(45) Date of Patent: Jan. 1, 2002

(54) REACTIVE OXYGEN-ASSISTED ION IMPLANTATION INTO METALS AND PRODUCTS MADE THEREFROM

(75) Inventors: Bruce D. Sartwell, Columbia; Paul M. Natishan, Annapolis, both of MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 08/304,960

(22) Filed: Sep. 13, 1994

(51) Int. Cl.⁷ .......................... C23C 14/08; C23C 14/48
(52) U.S. Cl. .................. 427/529; 427/527; 427/528; 427/531
(58) Field of Search ................... 427/528, 529, 427/531, 564, 585; 148/239, 276, 285, 286, 287; 204/192.15, 192.16, 192.22

(56) References Cited

U.S. PATENT DOCUMENTS

| | | | | |
|---|---|---|---|---|
| 3,341,352 A | * | 9/1967 | Ehlers ........................ | 427/528 |
| 3,737,343 A | * | 6/1973 | Basseches et al. .......... | 427/528 |
| 3,806,380 A | * | 4/1974 | Kitada et al. ............... | 148/239 |
| 3,898,607 A | * | 8/1975 | Gurev ................... | 204/192.22 |
| 3,925,579 A | * | 12/1975 | Flinchum et al. ........... | 148/276 |
| 4,314,874 A | * | 2/1982 | Abe et al. .................... | 427/529 |
| 4,333,808 A | * | 6/1982 | Bhattacharyya et al. .... | 427/529 |
| 4,433,004 A | * | 2/1984 | Yonezawa et al. .......... | 427/528 |
| 4,451,498 A | * | 5/1984 | Hashimoto et al. ......... | 427/529 |
| 4,486,247 A | * | 12/1984 | Ecer et al. .................... | 427/528 |
| 4,509,254 A | * | 4/1985 | Damrow et al. .......... | 427/126.3 |
| 4,613,386 A | | 9/1986 | Yates et al. | |
| 4,759,948 A | * | 7/1988 | Hashimoto et al. ......... | 427/530 |
| 4,767,678 A | | 8/1988 | Yates et al. | |

(List continued on next page.)

FOREIGN PATENT DOCUMENTS

| | | | | |
|---|---|---|---|---|
| EP | 166349 | * | 1/1986 | .................. 427/528 |
| GB | 2058146 | * | 4/1981 | .................. 427/528 |
| GB | 2125442 | * | 3/1984 | .................. 148/239 |

OTHER PUBLICATIONS

T.P. Hoar, *Corrosion Sci.*, 7, p. 341–355 (1967). No month.
"Aluminum", p. 279–281,ASM, Metals Park, Ohio (1984). J.E. Hatch, ed. No month.
A.H. Al–Saffar et al., *Corrosion Sci.*, 20, p. 127–144 (1980). No month.
J. Bentley et al., "Ion Implantation and Ion Beam Processing of Materials", Elsevier Science Publ. Co., Inc., p. 151–156 (1984). No month.
J.K. Hirvonen, ed. *Treatise on Material Sci. and Tech.*, vol. 18 V. Ashworth et al., "Ion Implantation", Academic Press, NY, pp. 176–255 (1980). No month.
G.K. Hubler et al, *Materials Science and Engineering*, 69, 203–210 (1985). No month.
P.M. Natishan et al., *J. Electrochem. Soc.*, 135, p. 321–327 (1988). Feb.

(List continued on next page.)

*Primary Examiner*—Marianne Padgett
(74) *Attorney, Agent, or Firm*—John J. Karasek; Stephen Hunnius

(57) ABSTRACT

A method of ion implantation using oxygen backfill and a modified surface layer formed therefrom are provided. The method of ion implantation includes the steps of placing a substrate metal in an ion implantation vacuum chamber, introducing oxygen into the ion implantation vacuum chamber and directing a beam of ions at the substrate metal. The modified surface includes a substrate metal and implanted atoms at a surface of the substrate metal. The implanted atoms are integrated with the substrate metal. The substrate metal has an implanted atom concentration of at least 5 atomic % to a depth of over 250 Å.

3 Claims, 6 Drawing Sheets

| | SAMPLE | DOSE ions/cm² (x 10¹⁶) | CONDITIONS | Epit (Vsce) | ΔEpit* (volts) | OXIDE THICKNESS (Å) |
|---|---|---|---|---|---|---|
| COMPARATIVE EXAMPLE 8 | Al | - | - | -0.700 | - | 41 |
| COMPARATIVE EXAMPLE 4 | Ta-Al | 4 | RT,BV | -0.650 | +0.050 | 43 |
| COMPARATIVE EXAMPLE 5 | Ta-Al | 4 | LN₂,BV | -0.525 | +0.175 | 36 |
| EXAMPLE 3 | Ta-Al | 4 | RT,OX | -0.275 | +0.425 | 41 |
| COMPARATIVE EXAMPLE 6 | Al-Al | 8 | RT,OX | -0.500 | +0.200 | 48 |
| COMPARATIVE EXAMPLE 7 | Ta-Al | 8 | RT,BV | -0.525 | +0.150 | 35 |
| EXAMPLE 4 | Ta-Al | 8 | RT,OX | +0.050 | +0.750 | 36 |

U.S. PATENT DOCUMENTS

| | | | | | |
|---|---|---|---|---|---|
| 5,098,736 | A | * | 3/1992 | Fukuda | 427/529 |
| 5,192,618 | A | * | 3/1993 | Frankel et al. | 148/239 |
| 5,196,102 | A | * | 3/1993 | Kumar | 427/528 |
| 5,383,934 | A | * | 1/1995 | Armini et al. | 427/528 |

OTHER PUBLICATIONS

P.M. Natishan et al., *Materials Science and Engineering*, A116, p. 41–46 (1989). No month.

B.D. Sartwell et al., "Characterization of Reactive–Oxygen Tantalum–Implanted M50 Stell", NRL, Washington, D.C. No date, no source of publication.

J.A. Knapp et al., "Amorphous Surface Layers in Ti–Implanted Fe", *Ion Implantation Metallurgy*, The Metallugical Society of AIME, pp. 152–161 (1980). No month, Preece et al, ed.

C.A. Carosella et al., "Friction & Wear Reduction of Bearing Steel via Ion Implantation", *Ion Implantation Metallurgy*, The Metallugical Society of AIME, pp. 103–115 (1980). No month, Preece et al, ed.

Natishan et al., *Nuc. Instr. and Meth. in Phys. Res.* B59/60 (1991) 841–844 "The pitting errosion behavior of Al ion implanted with Ta", (No month).

* cited by examiner

| | DOSE (ions/cm²) ions cm-2 | VACUUM CONDITION | AREAL DENSITY (x10¹⁷atoms/cm²) | | |
|---|---|---|---|---|---|
| | | | Ta | O | C |
| Comparative Example 1 | 1 x 10¹⁷ | 8 x 10⁻⁷ Torr | 0.43 | --- | 0.2 |
| Comparative Example 2 | 2 x 10¹⁷ | 8 x 10⁻⁷ Torr | 0.46 | --- | 0.25 |
| Example 1 | 1 x 10¹⁷ | 5 x 10⁻⁵ Torr O₂ | 0.88 | 3.6 | --- |
| Example 2 | 2 x 10¹⁷ | 5 x 10⁻⁵ Torr O₂ | 1.25 | 3.8 | --- |

FIG. 1

| | SAMPLE | DOSE ions/cm² (x 10¹⁶) | CONDITIONS | Epit (Vsce) | ΔEpit* (volts) | OXIDE THICKNESS (Å) |
|---|---|---|---|---|---|---|
| COMPARATIVE EXAMPLE 8 | Al | - | - | -0.700 | - | 41 |
| COMPARATIVE EXAMPLE 4 | Ta-Al | 4 | RT,BV | -0.650 | +0.050 | 43 |
| COMPARATIVE EXAMPLE 5 | Ta-Al | 4 | LN₂,BV | -0.525 | +0.175 | 36 |
| EXAMPLE 3 | Ta-Al | 4 | RT,OX | -0.275 | +0.425 | 41 |
| COMPARATIVE EXAMPLE 6 | Al-Al | 8 | RT,OX | -0.500 | +0.200 | 48 |
| COMPARATIVE EXAMPLE 7 | Ta-Al | 8 | RT,BV | -0.525 | +0.150 | 35 |
| EXAMPLE 4 | Ta-Al | 8 | RT,OX | +0.050 | +0.750 | 36 |

FIG. 6

REACTIVE OXYGEN-ASSISTED ION IMPLANTATION INTO METALS AND PRODUCTS MADE THEREFROM

BACKGROUND OF THE INVENTION

1. Field of the Invention

The present invention relates in general to implanting ions into a substrate metal and more particularly to improving the corrosion resistance of a substrate metal by implanting ions therein using oxygen in the ion implantation vacuum chamber.

2. Description of the Related Art

In general, the corrosion resistance of various metals such as iron-based alloys, aluminum, and aluminum-based alloys is provided by an oxide film which forms on the surface of the normally active metal and which prevents degradation by the environment. However, in environments that contain anions, such as chloride, the oxide film is locally degraded causing a loss of passivity and localized corrosion.

In the case of aluminum and aluminum alloys, it has been proposed to introduce alloying elements which improve corrosion resistance. However, such alloying elements create intermetallic phases which can disrupt the oxide film. Also, the alloying elements which improve corrosion resistance may be inconsistent with strength considerations. Moreover, most alloying elements which improve corrosion resistance have a limited solubility in aluminum.

It has also been proposed to form a solid solution surface alloy with surface modification techniques. Such surface modification techniques are non-equilibrium techniques, introducing alloying elements to a concentration beyond the normal solubility limits. The surface modification techniques, such as ion implantation, use a directed energy beam. More specifically it has been proposed to implant chromium ions into iron and low-alloy steel thereby producing a surface layer similar to stainless steel. Also, implantation of tantalum ions into low alloy steel was found to produce a surface which was somewhat more corrosion resistant than that for chromium implanted low alloy steel. For aluminum and aluminum alloys, it has been proposed to introduce molybdenum or tantalum atoms to increase the resistance to pitting.

One of the factors which limits the effectiveness of surface modification using ion implantation is sputtering, the erosion of atoms as a result of the impact of the incident ions being implanted. In the initial portion of the ion implantation process, atoms of the substrate metal are sputtered away. However, as the implantation progresses, the concentration of the implanted species increases and the erosion starts to effect the implanted species. Eventually the loss of atoms from sputtering equals the rate of implantation. At this point a steady state is reached. The steady state concentration can be given by $100\%/(S+1)$, where S is the sputter coefficient expressed in atoms removed per incident atom (atoms/ion).

It has been found that when tantalum atoms are implanted into steel at an implantation energy of 150 keV, the sputter coefficient is approximately 9. Therefore, the resulting surface concentration based on the formula $100\%/(S+1)$ is 10 atomic %. The maximum concentration of tantalum is at the surface of the substrate metal (steel in this case), and the peak tantalum concentration is greater than 5 atomic % and the implanted region extends to a depth of only 250 Å (1 microinch). While the tantalum-implanted steel exhibits some improvement in corrosion resistance, the low surface concentration is believed to limit such improvement in corrosion resistance.

As an alternative to using ion implantation, it has been proposed to deposit a coating on the substrate metal, for example using a technique such as physical vapor deposition. However, when a coating is deposited on the substrate metal by physical vapor deposition, there are potential adhesion problems between the substrate metal and the coating. Also, pinholes may form in the coating, which could lead to accelerated corrosion. A second method of forming a surface layer is ion beam-assisted deposition (IBAD). According to this method, a layer is deposited on the surface of the substrate metal while an ion beam is directed to the layer at an implantation energy which is significantly less than that used for standard ion implantation. It has been suggested that IBAD coatings should be greater than 0.5 microns in thickness in order to cover defects in the modified layer. Thus, coatings and IBAD have inherent drawbacks when used as a means of preventing corrosion.

SUMMARY OF THE INVENTION

Accordingly, it is an object of the present invention to provide a method of reducing surface corrosion in metals which does not involve conventional alloying.

Another object of the present invention is to produce a corrosion-resistant metal which does not involve coating the substrate metal.

It is yet a further object of the present invention to provide a method of ion implantation in which fewer implanted atoms are eroded by sputtering.

According to the present invention, a metal, such as iron, steel, aluminum and an aluminum alloy, is placed in an ion implantation vacuum chamber. Oxygen is then introduced into the ion implantation vacuum chamber to a pressure in the range of $1\times10^{-5}$ torr to $10\times10^{-5}$ torr. Then, a beam of ions, such as tantalum ions, are directed at the surface of the substrate metal.

The metallic surface layer of the present invention has implanted metal atoms integrated with substrate metal atoms. The substrate metal has a peak implanted atom concentration of at least 5 atomic % and the implanted layer extends to a depth of over 250 Å.

BRIEF DESCRIPTION OF THE DRAWINGS

The accompanying drawings illustrate several aspects of the present invention, and together with the detailed description, serve to explain the principles of the present invention. In the drawings:

FIG. 1 is a table comparing conventional best vacuum ion implantation of steel and oxygen backfill ion implantation of steel;

FIG. 6 is a table comparing the corrosion resistance of pure aluminum with that of aluminum implanted by various techniques.

DETAILED DESCRIPTION OF THE PREFERRED EMBODIMENTS

Figure 2:
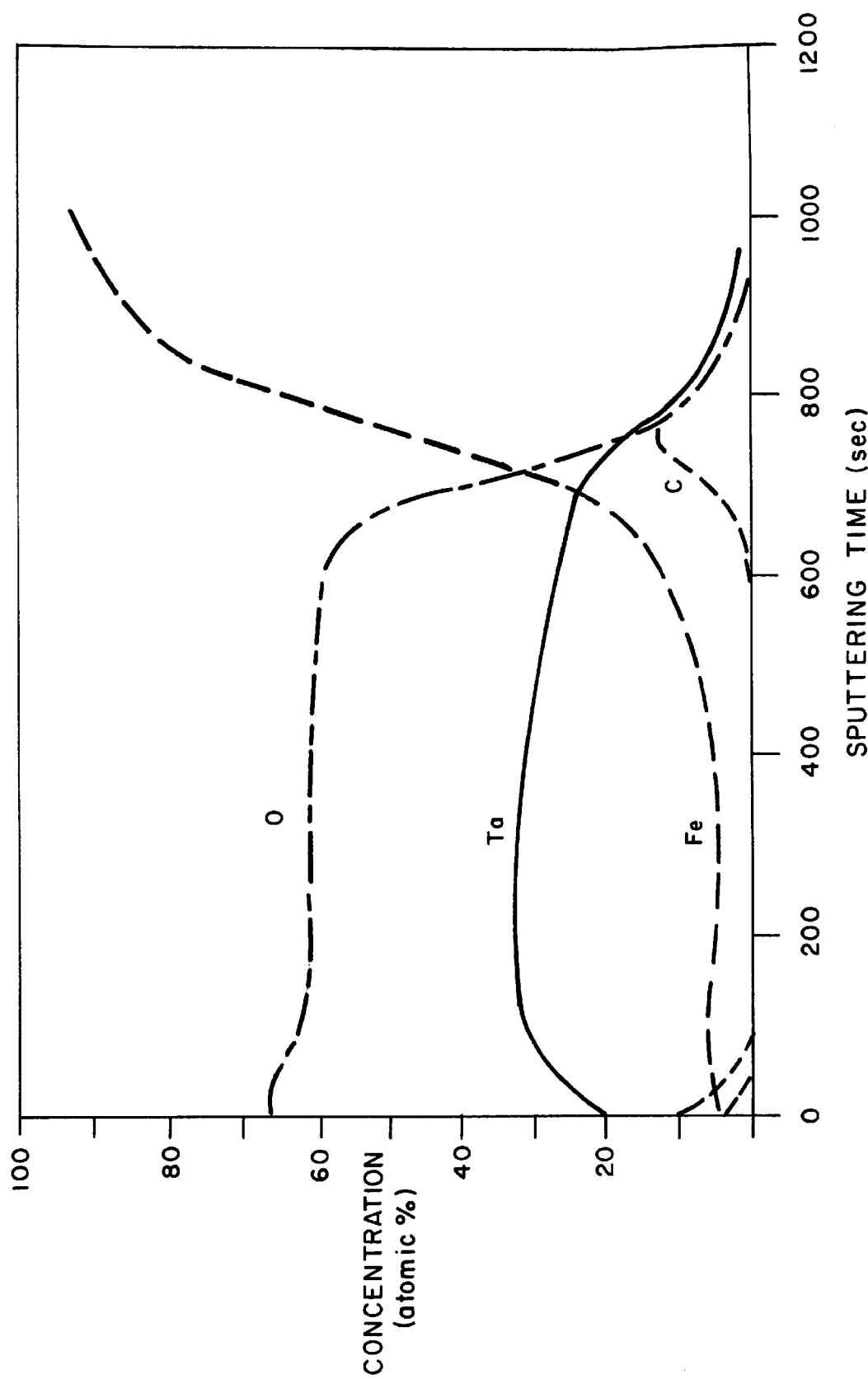
FIG. 2 is a graph showing a depth profile of steel implanted with oxygen backfill.

According to the present invention, a method of ion implantation and the metallic surface layer formed therefrom are provided. The method involves implantation using a conventional ion implantation apparatus. In conventional ion implantation, it was thought that the implantation chamber should be maintained as close as possible to a perfect vacuum ("best vacuum"). The reason for a best vacuum is so that the ions being implanted don't collide with other particles and scatter. In conventional ion implantation, the best vacuum condition is approximately $8 \times 10^{-7}$ torr.

Unlike conventional ion implantation methods, according to the present invention, the implantation chamber is not maintained at best vacuum condition. Instead, oxygen is backfilled into the implantation chamber. With the backfilled oxygen, the pressure in the chamber is within the range of 1 to $10 \times 10^{31\ 5}$ torr, and more typically in the range of 5 to $10 \times 10^{-5}$ torr. The oxygen reduces sputtering and improves corrosion resistance. Lower oxygen partial pressures may also be similarly useful. At some point, however, the oxygen partial pressure may be so low that no significant improvement in corrosion resistance will occur. This point has not yet been determined. If the oxygen content is too high, problems are caused related to collision of the ion beam with the oxygen molecules (scattering).

The present invention improves corrosion resistance for various metals, including iron, low alloy steels, aluminum and aluminum alloys.

As the ion being implanted, metal ions, and particularly transition metal ions such as tantalum, titanium, zirconium, tungsten and molybdenum, are typically used. Ions of non-metallic elements that readily react with oxygen, such as silicon, may also be used. Most often, the implanted ion, if metallic, will be a valve metal As the implantation energy, which is related to the speed imparted to the ions directed at the metal substrate and the depth of the implanted atoms, conventional implantation energies can be used. For example, an implantation energy in the range of 25 to 300 keV may be used. If the implantation energy is too low, the resulting surface layer is too shallow.

According to the present invention, a conventional dose of ions to the substrate metal is used. For example, steel can be dosed with 1 to $2 \times 10^{17}$ ions/cm². For aluminum, a typical dose may be in the range of 4 to $8 \times 10^{16}$ ions/cm².

A metallic surface layer is produced by the above method. The metallic surface layer has implanted atoms integrated with substrate metal atoms. The implanted atoms and the substrate metal atoms form a solid solution surface alloy at the surface of the substrate metal; the metallic surface layer has a peak implanted atom concentration of at least 5 atomic % and the implanted layer extends to a depth of over 250 Å. Preferably, there is a peak implanted atom concentration of at least 5 atomic %, with the implanted layer extending to a depth of 400 to 500 Å. In contrast, the implanted atom concentration at the outer surface of the substrate, may be very low in some cases. For example, when the substrate is aluminum, the implanted atom concentration in the near surface region (as determined by x-ray photoelectron spectroscopy) is on the order of 1 atomic percent. Apparently, this low near surface concentration increases to a peak concentration above the 5 atomic percent preference further into the bulk aluminum.

Having described the invention, the following examples are given to illustrate specific applications of the invention including the best mode now known to perform the invention. These specific examples are not intended to limit the scope of the invention described in this application.

EXAMPLES

First Embodiment

According to the first embodiment of the present invention, iron or low alloy steel is implanted with tantalum atoms.

Example 1

Example 1 was prepared by cutting a 0.5" diameter hardened M50steel rod to a thickness of ⅛". One face of the steel rod was polished to a diamond finish with 0.25 μm diamond paste in accordance with conventional techniques. Tantalum ions were implanted at normal incidence into the metal substrate (polished steel surface) at an implantation energy of 150 keV. A dose of $1 \times 10^{17}$ ions per cm² was used. Oxygen was introduced into the chamber with a resulting chamber pressure of $5 \times 10^{-5}$ torr.

Conventional Rutherford backscattering (RBS) was used to determine how much of the implanted tantalum remained, and thus, how much tantalum was lost due to sputtering. As shown in FIG. 1, the areal density of tantalum in Example 1 was found to be $0.88 \times 10^{17}$ atoms/cm². Areal density, while expressed in units of atoms/cm², is actually a measure of the total number of atoms present in the surface layer. The areal density of oxygen was found to be $3.6 \times 10^{17}$ atoms/cm². No carbon was present. It should be noted that, if no tantalum was lost due to sputtering, the areal density of tantalum would be equal to the dose of tantalum, in this case, $1 \times 10^{17}$ atoms/cm².

Through analysis of the surface layer, it was found that an almost pure tantalum oxide ($Ta_2O_5$) layer was formed. Even under the assumption that the presence of oxygen reduced the sputtering of tantalum atoms, the formation of a tantalum oxide film is not predicted, thereby making this an unusual and somewhat remarkable result.

Example 2

Example 2 was prepared by implanting M50 steel with tantalum according to the method used for Example 1, except that a dose of $2 \times 10^{17}$ ions/cm² was used. The results of RBS analysis are shown in FIG. 1. As can be seen, doubling the dose from 1 to $2 \times 10^{17}$ ions/cm² increased the areal density of tantalum atoms from 0.88 to $1.25 \times 10^{17}$ atoms per cm². The areal density of oxygen increased to $3.8 \times 10^{17}$ atoms per cm².

A depth profile was performed on the steel substrate, with the results being shown in FIG. 2. Conventional Auger electron spectroscopy (AES) was used for the depth profile. According to the AES method, the surface of the target metal is sputtered away and the concentration of iron, carbon, tantalum and oxygen is measured as the sputtering progresses. At the later sputtering times, a deeper concentration is determined. Thus, the sputtering time is related to the depth of the implanted layer. As can be seen from FIG. 4, the tantalum concentration did not fall below 20 atomic % until a sputtering time of approximately 650 seconds. 650 seconds would correspond to a depth of approximately 400 Å.

Electrochemical corrosion studies were performed on Example 2. In the studies, the substrate metal was attached to electrode holders. The edge of the face to be tested and the sides of the substrate were masked with several coats of an insulating paint. Electrochemical measurements were made in deaerated 0.1 M NaCl solution using a conventional corrosion cell. The 0.1 M NaCl solution was made with reagent grade NaCl and triply distilled water. The solution pH was 5.8. Ar was used to deaerate the solution. The metal substrate was immersed in the solution for 24 hours to establish a steady state open circuit potential. The anodic polarization curve was determined using a potential step technique with the results being shown in FIG. 3. The current density (plotted on logarithmic scale in μA/cm²) is shown on the Y axis. The current density is related to how rapidly the metal is corroding. On the X axis, the potential is recorded as the voltage of the saturated Calomel electrode ($V_{SCE}$). As shown by the curve for Example 2, the current density at a potential of −0.4 $V_{SCE}$ is between 1 and 0.1 mA/cm$^2$.

As in Example 1, analysis of the surface layer of Example 2 showed that an almost pure tantalum oxide layer was formed.

Comparative Example 1

M50 steel was implanted by the same method used for Example 1, except that the implantation chamber was maintained at best vacuum conditions. That is, the pressure in the chamber was approximately 8×10$^{-7}$ torr and substantially no oxygen was present. As can be seen in FIG. 1, the areal density of tantalum was shown to be 0.43 atoms/cm$^2$. As expected, no oxygen was present. The areal density of carbon was 0.2 atoms/cm$^2$.

Comparative Example 2

M50 steel was implanted according to the same procedure used for Comparative Example 1, except that a dose of 2×10$^{17}$ ions/cm$^2$ was used. As shown in FIG. 1, doubling the dose only increased the tantalum concentration from 0.43 to 0.46×10$^{17}$ atoms/cm$^2$. However, introducing oxygen into the chamber did significantly increase the amount of tantalum retained in the metal substrate by almost a factor of 3 for incident doses of 2×10$^{17}$ ions/cm$^2$ (compare Example 2 and Comparative Example 2).

Figure 4:
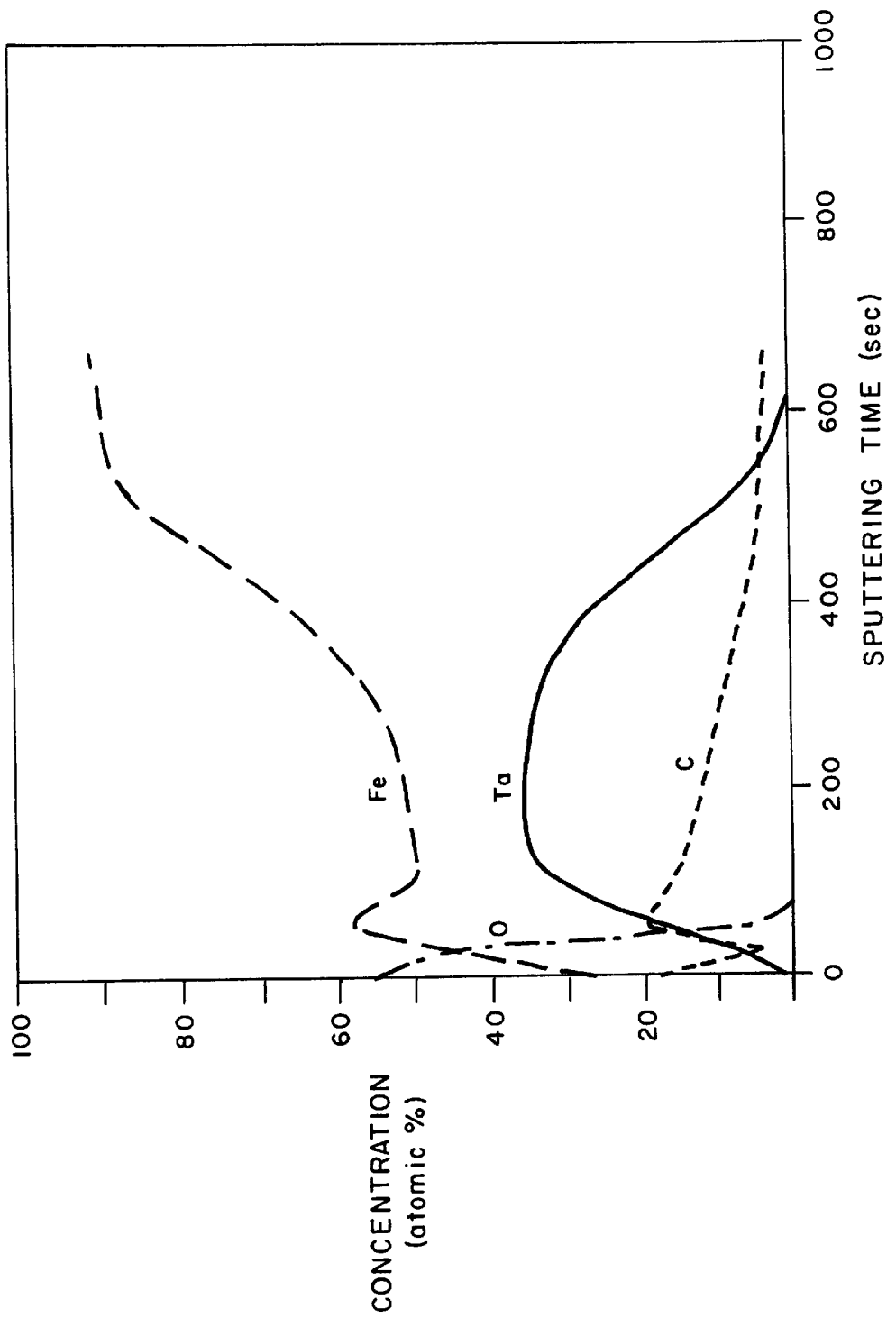
FIG. 4 is a graph showing a depth profile of steel implanted by conventional techniques.

A depth profile was performed on Comparative Example 2 using AES and the same procedure used for Example 2. As shown in FIG. 4, the tantalum concentration fell below 20 atomic % at a sputtering time of approximately 450 seconds. 450 seconds would correspond to a depth of only approximately 250 Å, a depth of 150 Å less than that for Example 2.

Figure 3:
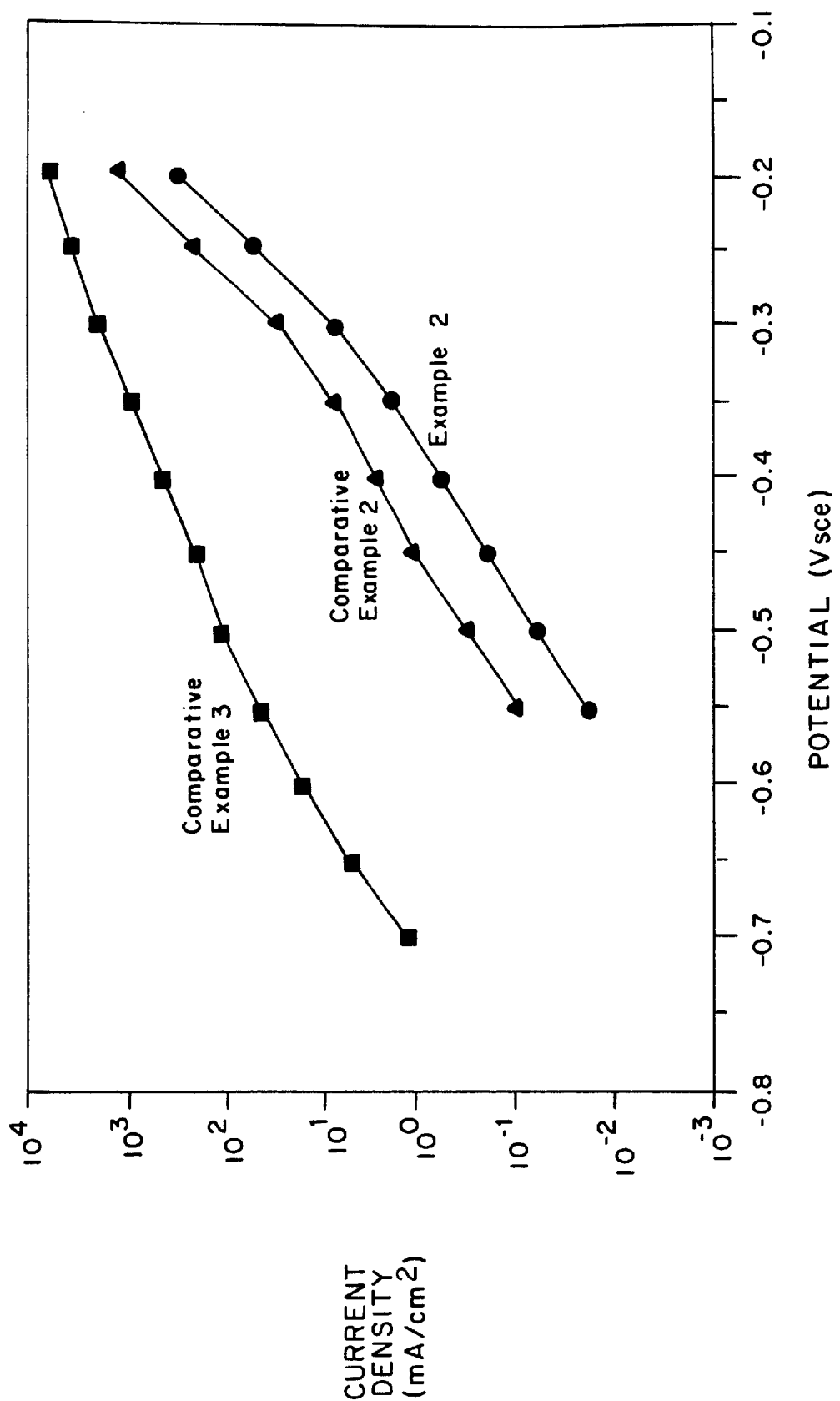
FIG. 3 is a graph comparing the corrosion behavior of steel, best vacuum implanted steel and steel implanted with oxygen backfill.

Electrochemical corrosion studies were performed on Comparative Example 2 using the same techniques as used for Example 2. The results are shown in FIG. 3. As can be seen from the curve of Comparative Example 2 shown in FIG. 3, the corrosion resistance is less (more rapid corrosion) when oxygen is not used in the ion implantation chamber. For a potential of −0.4 $V_{SCE}$, the current density was between 1 and 10 mA/cm$^2$.

The pitting resistance was determined for Example 2 and Comparative Example 2 based on the results shown in FIG. 3. A higher (more positive) pitting resistance represents an increased resistance to pit initiation. That is, the pitting resistance is the $V_{SCE}$ where the current density begins to rapidly increase. At his point, the corrosion resistance begins to fall. The pitting resistances for Example 2 and Comparative Example 2 were −0.450 and −0.400 $V_{SCE}$, respectively.

The density of the pits on Example 2 and Comparative Example 2 was measured by conventional techniques, and the density was much higher for Comparative Example 2 in which there was no oxygen backfill. The results of these tests indicate that the tantalum implanted with oxygen backfill (Example 2) produced corrosion resistance better than tantalum implantation by itself.

Comparative Example 3

In Comparative Example 3, a M50 steel rod was tested. No ion implantation was used for Comparative Example 3. Electrochemical corrosion studies were performed on Comparative Example 3 using the same techniques as used on Example 2 and Comparative Example 2. The results are shown in FIG. 3. As can be seen from the curve for Comparative Example 3, the corrosion resistance for an unimplanted M50 steel rod is orders of magnitude worse than that for the implanted rods of Example 2 and Comparative Example 2. For a potential of −0.4 $V_{SCE}$, the current density was between 100 and 1000 mA/cm$^2$.

As shown in FIG. 3, at a potential below −0.25 $V_{SCE}$, the current density was at least two orders of magnitude higher than that for Example 2 (oxygen backfill) and Comparative Example 2 (best vacuum). Scanning electronmicrographs, in conjunction with the polarization curves of FIG. 3, showed that the M50 steel underwent extensive uniform corrosion, whereas both of the implanted samples (Example 2 and Comparative Example 2 ) did not.

Embodiment 2

According to a second embodiment of the present invention, it is possible to implant ions into aluminum or aluminum alloys.

Example 3

A 99.999% pure aluminum sample was polished to a 1 $\mu$m finish using conventional techniques. Tantalum ions were implanted at normal incidence into the aluminum metal substrate at an energy of 150 keV at a dose of 4×10$^{16}$ ions/cm$^2$. Oxygen was introduced into the implantation chamber to a pressure of 5×10$^{-5}$ torr. The implantation was carried out at room temperature (RT).

Example 4

Example 4 was prepared in the same manner as that used for Example 3 except that a dose of 8×10$^{16}$ ions per cm$^2$ was used.

Comparative Example 4

Comparative Example 4 was prepared in the same manner as that used for Example 3 except that the implantation chamber was maintained at best vacuum conditions (BV). That is, the pressure in the implantation chamber was approximately 8×10$^{-7}$ torr. Further, an implantation energy of 100 keV, rather than 150 keV, was used.

Comparative Example 5

Comparative Example 5 was prepared in the same manner as Comparative Example 4 except that the implantation was conducted at the temperature of liquid nitrogen (LN$_2$) rather than at room temperature. The implantation was performed at liquid nitrogen temperature to inhibit radiation and enhance diffusion of the tantalum away from the surface. Further, an implantation energy of 100 keV, rather than 150 keV, was used.

Comparative Example 6

Comparative Example 6 was prepared in the same manner as Example 4 except that aluminum ions were implanted instead of tantalum ions. Aluminum was implanted into the aluminum for the purpose of determining if the improved corrosion resistance was simply the result of the presence of oxygen in the chamber, or the result of the interaction of the implanted tantalum with oxygen, similar to what was observed for the first embodiment.

Comparative Example 7

Comparative Example 7 was prepared in the same manner as Example 4 except that the pressure in the implantation chamber was maintained at best vacuum, approximately 8×10$^7$ torr.

Comparative Example 8

In Comparative Example 8, a 99.999% pure polished aluminum (the metal substrate) was used. The metal substrate was not dosed with implantation ions.

Figure 5:
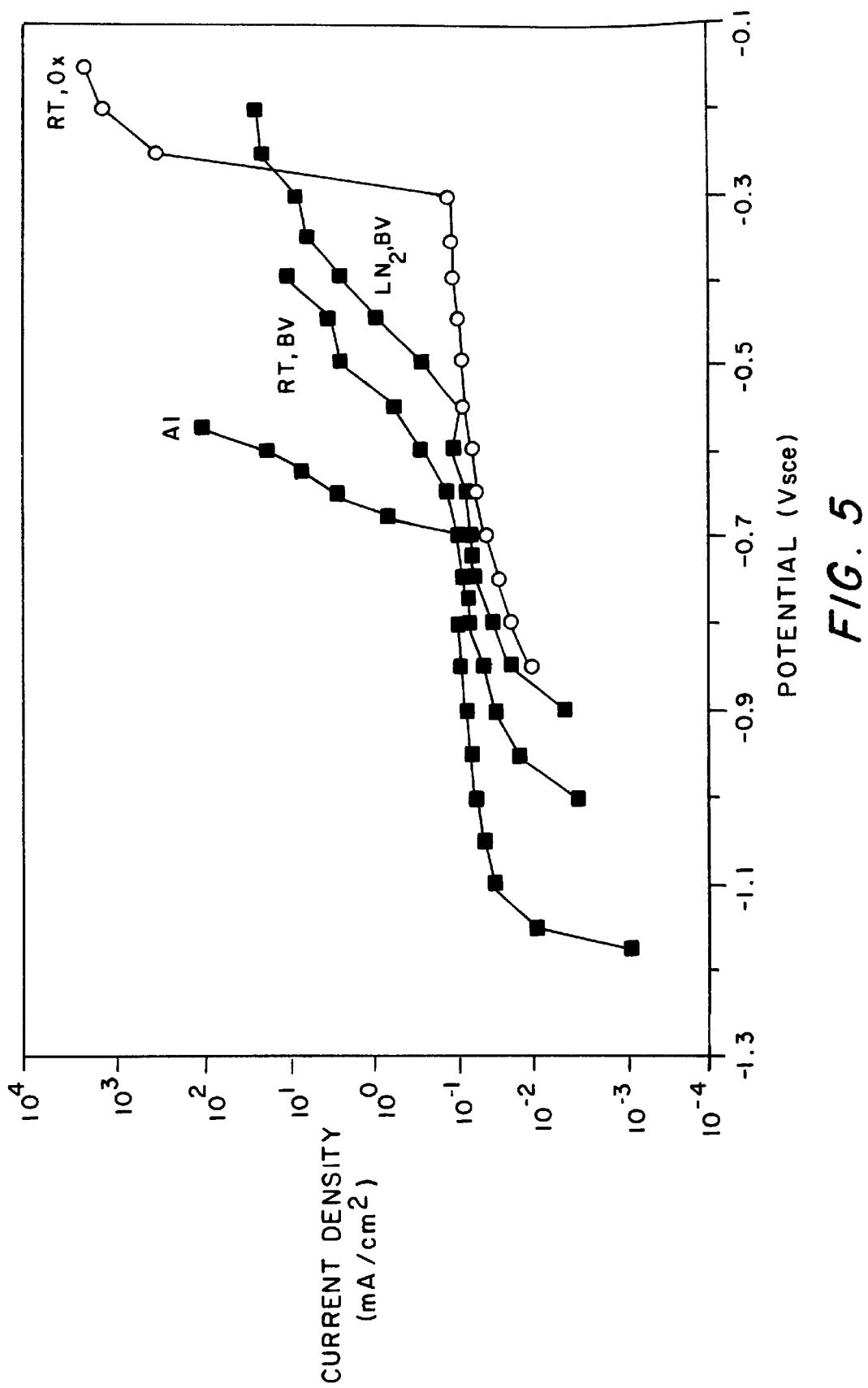
FIG. 5 is a graph comparing corrosion behavior of pure aluminum and aluminum implanted by various techniques.

Electrochemical corrosion studies were performed on Example 3 and Comparative Examples 3–5 and 8 in the same manner as that done for the first embodiment. The results of the electrochemical corrosion studies are shown in FIG. 5. As can be seen in FIG. 5, the anodic polarization curves are plotted for Example 3 (RT, Ox), Comparative Example 4 (RT, BV), Comparative Example 5 (LN$_2$, BV) and Comparative Example 8 (Al). As shown in FIG. 5, Example 3 exhibited the greatest increase in pitting potential, followed in order by Comparative Example 5, Comparative Example 4 and Comparative Example 8. Higher pitting potentials indicate a greater resistance to pit initiation.

FIG. 6 shows a summary of results for tests performed on Examples 3 and 4, and Comparative Examples 4–8. In the fifth column is the pitting potential ($E_{pit}$) as determined from anodic polarization curves, some of which are shown in FIG. 5. For example, as to Comparative Example 8, the slope of the respective anodic polarization curve increases greatly at a pitting potential of –0.700 $V_{SCE}$. At this point, the aluminum is beginning to rapidly undergo pitting corrosion. In the sixth column of FIG. 6, the pitting potential of Examples 3 and 4, and Comparative Examples 4–7 is compared with that of Comparative Example 8 (the unimplanted aluminum sample).

In the seventh column of FIG. 6, the oxide thickness is given in Å. The oxide thickness was determined by conventional X-ray photoelectron spectroscopy. Although the X-ray photoelectron spectroscopy method has a margin of error, it can be seen that the oxide thickness did not vary substantially. X-ray photoelectron spectroscopy has also shown that the near surface concentration is significantly lower than in the case of the M-50 steels. Moreover, the aluminum samples made using reactive oxygen-assisted ion implantation according to the present invention appear to have a lower near surface concentration of tantalum than aluminum samples implanted with tantalum using best vacuum conditions. These results contrast with the results obtained by implantation of tantalum into M-50 steel.

As shown in FIG. 6, for those samples implanted with a dose of $4 \times 10^{16}$ ions/cm$^2$, tantalum implantation alone (Comparative Example 4) produced only a very small increase (improvement) in pitting potential. Implantation of tantalum at liquid nitrogen temperature with no oxygen (Comparative Example 5) resulted in some additional improvement. However, implantation with oxygen backfill (Example 3) resulted in a substantial increase in the pitting potential. For the implantation with a dose of $8 \times 10^{16}$ ions/cm$^2$, the tantalum implantation at room temperature without oxygen (Comparative Example 7) again showed a modest increase in pitting potential (0.150 volts). Aluminum implantation at room temperature with oxygen backfill (Comparative Example 6) resulted in a modest increase as well. However, a very substantial increase in the pitting potential was obtained for the sample implanted with tantalum at room temperature with oxygen present (Example 4). Example 4 had an average pitting potential of 0.750 volts higher than that of pure aluminum, and 0.600 volts higher than that of tantalum implanted without oxygen at the same dose (Comparative Example 7), despite their apparently lower near surface concentration of tantalum.

The present invention provides many benefits over conventional ion implantation. In steel, an almost pure tantalum oxide layer was formed, thereby improving corrosion resistance. In aluminum, the modified surface layer was extremely resistant to pit initiation.

The metal substrate having a modified surface layer produced in accordance with the present invention could be very useful in the electronics industry, where small pits in aluminum can lead to failure of a device. Further, it could be useful in the aeronautic industry, to impart corrosion resistance to bearings, gears and other components fabricated from low alloy steels or aluminum alloys which are highly susceptible to pitting corrosion.

Numerous modifications and variations of the present invention are possible in light of the above teachings. It is therefore to be understood that within the scope of the appended claims, the invention may be practiced otherwise than as specifically described herein.

What is claimed is:

1. A method of ion implantation, comprising the steps of:

placing a substrate metal selected from the group consisting of aluminum and aluminum-based alloys in an ion implantation vacuum chamber;

introducing oxygen molecules into the ion implantation vacuum chamber to a pressure in the range of $1 \times 10^{-5}$ torr to $10 \times 10^{31\ 5}$ torr; and directing a beam of ions at the substrate metal, said ion being selected from the group consisting of tantalum ions, titanium ions, zirconium ions, tungsten ions, molybdenum ions, and silicon ions.

2. The method of ion implantation of claim 1, wherein the implanted ion is tantalum.

3. The method of ion implantation of claim 1, wherein oxygen is introduced into the vacuum chamber to a pressure in the range of $5 \times 10^{-5}$ torr to $10 \times 10^{-5}$ torr.

* * * * *